(12) United States Patent
Lee et al.

(10) Patent No.: US 10,783,834 B2
(45) Date of Patent: Sep. 22, 2020

(54) PIXEL CIRCUIT AND ORGANIC LIGHT EMITTING DISPLAY DEVICE

(71) Applicant: Samsung Display Co., Ltd., Yongin-si, Gyeonggi-Do (KR)

(72) Inventors: Takyoung Lee, Yongin-si (KR); Yunmo Chung, Yongin-si (KR); Ilhun Seo, Yongin-si (KR); Miyeon Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/287,324

(22) Filed: Feb. 27, 2019

(65) Prior Publication Data
US 2019/0266953 A1 Aug. 29, 2019

(30) Foreign Application Priority Data

Feb. 28, 2018 (KR) .................. 10-2018-0024722

(51) Int. Cl.
*G09G 3/3291* (2016.01)
*G02B 27/01* (2006.01)
(Continued)

(52) U.S. Cl.
CPC ....... *G09G 3/3291* (2013.01); *G02B 27/0172* (2013.01); *G09G 3/3233* (2013.01);
(Continued)

(58) Field of Classification Search
CPC ..................... G09G 3/3233; G09G 3/3258
(Continued)

(56) References Cited

U.S. PATENT DOCUMENTS

2008/0246698 A1* 10/2008 Eom .................... G09G 3/3266
345/76
2011/0292015 A1* 12/2011 Komiya ................. G09G 3/003
345/211
(Continued)

FOREIGN PATENT DOCUMENTS

EP        2 232 557          9/2010
KR    10-2012-0043302 A     5/2012
(Continued)

OTHER PUBLICATIONS

Extended European search report dated Mar. 27, 2019 of the corresponding European Patent Application No. 19159553.7.

*Primary Examiner* — Koosha Sharifi-Tafreshi
(74) *Attorney, Agent, or Firm* — Kile Park Reed & Houtteman PLLC

(57) ABSTRACT

A pixel circuit to be connected to a data line and first and second power supply lines includes a light emitting element connected between the first power supply line and the second power supply line; a driving transistor to control a current flowing from the first power supply line to the second power supply line through the light emitting element according to a voltage of a first node; a first switching element connected between the first node and a second node; a second switching element connected between the second node and a third node; a first capacitor connected between the first power supply line and the first node; and a second capacitor connected between the second node and the data line.

23 Claims, 7 Drawing Sheets

(51) Int. Cl.
*G09G 3/3233* (2016.01)
*G09G 3/3266* (2016.01)
*H01L 27/32* (2006.01)

(52) U.S. Cl.
CPC ....... *G09G 3/3266* (2013.01); *H01L 27/3276* (2013.01); *G09G 2300/0426* (2013.01); *G09G 2300/0439* (2013.01); *G09G 2300/0465* (2013.01); *G09G 2300/0809* (2013.01); *G09G 2300/0819* (2013.01); *G09G 2300/0852* (2013.01); *G09G 2300/0866* (2013.01); *G09G 2310/08* (2013.01); *G09G 2320/0233* (2013.01); *G09G 2320/0257* (2013.01); *G09G 2330/028* (2013.01)

(58) Field of Classification Search
USPC .......................................................... 345/76
See application file for complete search history.

(56) References Cited

U.S. PATENT DOCUMENTS

| 2012/0026145 A1* | 2/2012 | Jeong ................... G09G 3/3233 345/211 |
| 2013/0222356 A1 | 8/2013 | Jeong et al. |
| 2016/0203756 A1 | 7/2016 | Kawabe |
| 2016/0275869 A1 | 9/2016 | Hwang et al. |
| 2017/0200416 A1 | 7/2017 | Kim et al. |

FOREIGN PATENT DOCUMENTS

| KR | 10-2017-0015649 A | 2/2017 |
| KR | 10-2017-0083661 A | 7/2017 |
| KR | 10-2017-0083689 A | 7/2017 |

\* cited by examiner

PIXEL CIRCUIT AND ORGANIC LIGHT EMITTING DISPLAY DEVICE

CROSS-REFERENCE TO RELATED APPLICATION

Korean Patent Application No. 10-2018-0024722, filed on Feb. 28, 2018, in the Korean Intellectual Property Office, and entitled: "Pixel Circuit and Organic Light Emitting Display Device," is incorporated by reference herein in its entirety.

BACKGROUND

1. Field

One or more embodiments relate to a pixel circuit and an organic light emitting display device.

2. Description of the Related Art

An organic light emitting display device includes a light emitting element, e.g., an organic light emitting diode, whose luminance varies with an applied current. A pixel in the organic light emitting display device includes an organic light emitting diode, a driving transistor for controlling the amount of a current supplied to the organic light emitting diode according to the voltage between a gate electrode and a source electrode, and a switching transistor for transmitting a data voltage for controlling the luminance of the organic light emitting diode to the driving transistor.

Due to manufacturing process errors, the driving transistors in the organic light emitting display device may have different threshold voltages from one other. Thus, even if the same data voltage is applied thereto, the amount of a current output by the driving transistors may be different depending on the respective threshold voltages. Further, the amount of a current to be output by the driving transistors during the current frame period may vary with the amount of a current output during the previous frame period. Further, when the organic light emitting diode emits light during the previous frame period, the organic light emitting diode may slightly emit light even though a full black picture should be displayed during the current frame period.

Accordingly, the pixel may further include a plurality of transistors in addition to the driving transistor and the switching transistor. Further, control lines for controlling the added transistors may be additionally required. As such, when transistors and control lines for controlling the transistors are added to the pixel, the area occupied by the pixel increases, making it difficult to increase pixel density resolution of the organic light emitting display device.

SUMMARY

According to one or more embodiments, a pixel circuit to be connected to a data line and first and second power supply lines includes: a light emitting element connected between the first power supply line and the second power supply line; a driving transistor controlling a current flowing from the first power supply line to the second power supply line through the light emitting element according to a voltage of a first node; a first switching element connected between the first node and a second node; a second switching element connected between the second node and a third node; a first capacitor connected between the first power supply line and the first node; and a second capacitor connected between the second node and the data line.

According to one or more embodiments, a display device includes: a first power supply line; a second power supply line; a data line; a pixel including a first switching element connected between a first node and a second node, a second switching element connected between the second node and a third node, a driving transistor controlling a current flowing from the first power supply line to the third node according to a voltage of the first node, a light emitting element connected between the third node and the second power supply line, a first capacitor connected between the first power supply line and the first node, and a second capacitor connected between the second node and the data line; and a controller controlling the first and second switching elements, the first and second power supply lines, and the data line, during one frame period including first to seventh sequential periods.

According to one or more embodiments, an organic light emitting display device includes: a pixel connected to a first power supply line, a second power supply line, a scan line, a control line, and a data line; and a driver controlling the first power supply line, the second power supply line, the scan line, the control line, and the data line, during first to seventh sequential periods, wherein the pixel includes: an organic light emitting diode having a first electrode and a second electrode connected to the second power supply line; a first transistor having a gate electrode, a first electrode connected to the first power supply line, and a second electrode connected to the first electrode of the organic light emitting diode; a second transistor having a control electrode connected to the scan line, a first electrode connected to the gate electrode of the first transistor, and a second electrode; a third transistor having a control electrode connected to the control line, a first electrode connected to the second electrode of the second transistor, and a second electrode connected to the second electrode of the first transistor; a first capacitor connected between the first power supply line and the gate electrode of the first transistor; and a second capacitor connected between the second electrode of the second transistor and the data line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
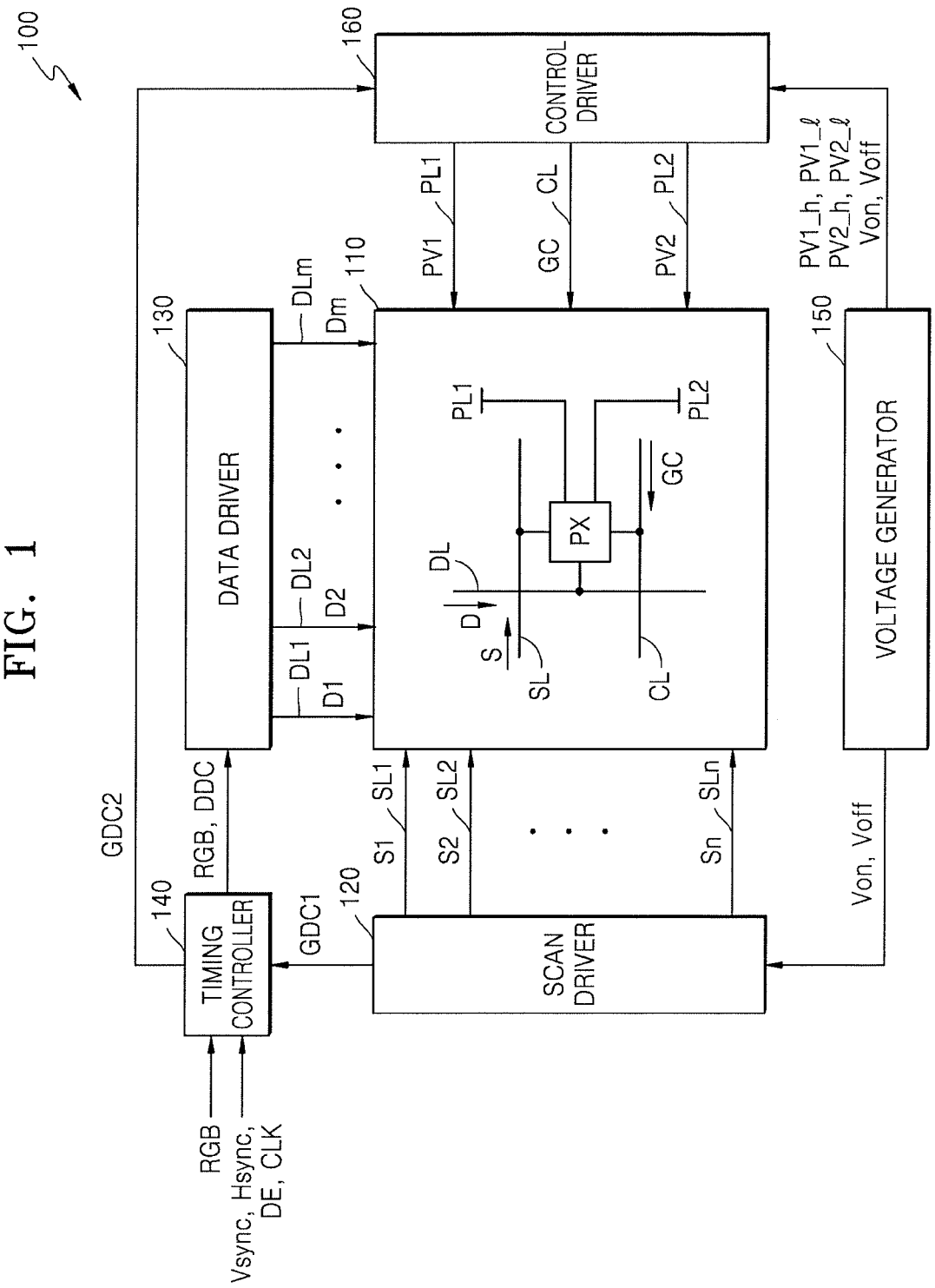
FIG. 1 illustrates a schematic block diagram of an organic light emitting display device according to an embodiment.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list.

Hereinafter, the present disclosure will be described in detail by explaining exemplary embodiments of the present disclosure with reference to the attached drawings. Like reference numerals in the drawings denote like elements, and thus their description will be omitted.

It will be understood that, although the terms first, second, etc. may be used herein to describe various elements, these elements should not be limited by these terms. These terms are only used to distinguish one element from another. Further, the singular forms "a," "an" and "the" are intended to include the plural forms as well, unless the context clearly indicates otherwise. It will be understood that the terms such as "include," "comprise," and "have" used herein specify the presence of stated features or components, but do not preclude the presence or addition of one or more other features or components. It will be further understood that when a layer, region, or component is referred to as being "on" another layer, region, or component, it can be directly or indirectly on the other layer, region, or component. That is, for example, intervening layers, regions, or components may be present.

FIG. 1 is a schematic block diagram of an organic light emitting display device according to an embodiment. Referring to FIG. 1, an organic light emitting display device. 100 may include a display unit 110, a scan driver 120, a data driver 130, a timing controller 140, a voltage generator 150, and a control driver 160.

The display unit 110 may include a plurality of pixels PX. Although only one pixel PX is shown in FIG. 1, this is for just for ease of understanding. The pixels PX may be arranged, in an embodiment, in a matrix.

The pixels PX may be connected to scan lines SL1 to SLn and data lines DL1 to DLm. The scan lines SL1 to SLn may transmit scan signals S1 to Sn output from the scan driver 120 to the pixels PX in the same row, respectively. The data lines DL1 to DLm may transmit data signals D1 to Dm output from the data driver 130 to the pixels PX in the same column, respectively. The pixel PX may be connected to the scanning line SL located in the same row among the scanning lines SL1 to SLn and may be connected to the data line DL located in the same column among the data lines DL1 to DLm.

The pixels PX may be commonly connected to a control line CL and first and second power supply lines PL1 and PL2. The control line CL and the first and second power supply lines PL1 and PL2 may be driven by the control driver 160.

The control line CL may include a plurality of sub control lines connected to the pixels PX in the matrix. The sub control lines may extend in the row direction in parallel with the scan lines SL1 to SLn. The scan lines SL1 to SLn may transmit the scan signals S1 to Sn to the pixels PX at different timings, but all of the sub control lines may transmit a control signal GC to the pixels PX at the same timing. The sub control lines may all be electrically connected to each other. The electrically connected sub control lines may be collectively referred to as a control line CL.

The first power supply line PL1 may include a plurality of sub power supply lines connected to the pixels PX in the matrix. The sub power supply lines may extend in the column direction in parallel with the data lines DL1 to DLm. According to another embodiment, the sub power supply lines may extend in the row direction in parallel with the scan lines SL1 to SLn. The sub power supply lines may be all electrically connected to each, and may have the same timing and varying voltage levels. The electrically connected sub power supply lines may be collectively referred to as a first power supply line PL1. The voltage applied to the first power supply line PL1 may be varied within one frame period and is referred to as a first power supply voltage PV1. The first power supply voltage PV1 may have two different levels, that is, a first level and a second level. The first power supply voltage PV1 of the first level may be referred to as a first level voltage PV1_$h$, and the first power supply voltage PV1 of the second level may be referred to as a second level voltage PV1_$l$. The first level voltage PV1_$h$ may be greater than the second level voltage PV1_$l$.

The second power supply line PL2 may be commonly connected to the light emitting elements of the pixels PX in the form of a common electrode. The voltage applied to the second power supply line PL2 may be varied within one frame period and is referred to as a second power supply voltage PV2. The second power supply voltage PV2 may have two different levels, that is, a third level and a fourth level. The second power supply voltage PV2 of the third level may be referred to as a third level voltage PV2_$h$, and the second power supply voltage PV2 of the fourth level may be referred to as a fourth level voltage PV2_$l$. The third level voltage PV2_$h$ may be greater than the fourth level voltage PV2_$l$.

According to an embodiment, the first level voltage PV1_$h$ applied to the first power supply line PL1 may be substantially equal to the third level voltage PV2_$h$ applied to the second power supply line PL2. In this case, the first level voltage PV1_$h$ and the third level voltage PV2_$h$ may be generated from a high level voltage PVh. Further, the second level voltage PV1_$l$ applied to the first power supply line PL1 may be substantially equal to the third level voltage PV2_$l$ applied to the second power supply line PL2. In this case, the second level voltage PV1_$l$ and the fourth level voltage PV2_$l$ may be generated from a low level voltage PV1. The high level voltage PVh and the low level voltage PV1 may be referred to as a first driving voltage ELVDD and a second driving voltage ELVSS, respectively.

The pixel PX may include a light emitting element and a driving transistor for controlling the amount of a current flowing to the light emitting element based on a data voltage Vdata of the received data signal D. The data signal D may be transmitted from the data driver 130 through the corresponding data line DL, and may include a reference voltage Vref and a data voltage Vdata. The light emitting element may emit light at a luminance determined based on the data voltage Vdata.

When a unit pixel includes a plurality of subpixels for displaying a full color, the pixel PX may correspond to a part of the unit pixel, i.e., a subpixel. The light emitting element may be an organic light emitting diode. The pixel PX will be described in more detail below with reference to FIGS. 2 and 3.

The voltage generator 150 may generate voltages used for the operations of the scan driver 120 and the control driver 160. In an embodiment, the voltage generator 150 may generate the first level voltage PV1_$h$ and the second level voltage PV1_$l$ applied to the first power supply line PL1 and the third level voltage PV2_$h$, and the fourth level voltage PV2_$l$ applied to the second power supply line PL2, and may provide these generated voltages to the control driver 160. The first level voltage PV1_$h$ and the fourth level voltage PV2_$l$ may be voltages applied to the first power supply line PL1 and the second power supply line PL2 during a light emission period in which the light emitting element emits light. The second level voltage PV1_$l$ may be a voltage applied to the first power supply line PL1 during at least a part of a non-light emission period in which the light emitting element does not emit light. The third level voltage PV2_$h$ may be a voltage applied to the second power supply line PL2 during the non-light emission period.

According to another embodiment, when the first level voltage PV1_$h$ and the third level voltage PV2_$h$ are generated from the high level voltage PVh and the second level voltage PV1_$l$ and the fourth level voltage PV2_$l$ are generated from the low level voltage PV1, the voltage generator 150 may generate the high level voltage PVh and the low level voltage PV1 and provide these generated voltages to the control driver 160.

The voltage generator 150 may generate a turn-off voltage Voff and a turn-on voltage Von for controlling a switching element e.g., a switching transistor, of the pixel PX, and provide these generated voltages to the scan driver 120 and the control driver 160. When the turn-off voltage Voff is applied to the gate electrode of the switching transistor, the switching transistor is turned off, and when the turn-on voltage Von is applied to the gate electrode of the switching transistor, the switching transistor is turned on. When the switching transistor is a p-type metal-oxide semiconductor field effect transistor (MOSFET), the level of the turn-off voltage Voff may be higher than the level of the turn-on voltage Von. When the switching transistor is an n-type MOSFET, the level of the turn-off voltage Voff may be lower than the level of the turn-on voltage Von.

The voltage generator 150 may generate voltages at other levels in addition to the above-described voltages and provide these generated voltages to the scan driver 120 and the control driver 160. Further, the voltage generator 150 may generate gamma reference voltages and provide these gamma reference voltages to the data driver 130.

The timing controller 140 may control operation timings of the scan driver 120, the data driver 130, and the control driver 160 to control the pixels PX of the display unit 110. Each of the pixels PX may receive a new data voltage Vdata for each frame and emit light at a luminance corresponding to the received data voltage Vdata, so that the display unit 110 may display an image corresponding to image data RGB of one frame. According to an embodiment, one frame period may include a plurality of periods, e.g., a light-off period, first to third initiation periods, a compensation period, a data writing period, and a light emission period. According to an embodiment, all the pixels PX in the display unit 110 may emit light at the same time. According to another embodiment, when the display unit 110 is divided into a plurality of regions, e.g., a region for displaying an image for a left eye and a region for displaying an image for a right eye, the pixels PX in each region may emit light at the same time.

The timing controller 140 may receive a vertical synchronization signal Vsync, a horizontal synchronization signal Hsync, a data enable signal DE, a clock signal CLK, and image data RGB from the outside. The timing controller 140 may control the operation timings of the scan driver 120, the data driver 130, and the control driver 160 by using timing signals such as a vertical synchronization signal Vsync, a horizontal synchronization signal Hsync, a data enable signal DE, and a clock signal CLK. The timing controller 140 may determine the frame period by counting the data enable signal DE of one horizontal scanning period, and in this case, the vertical synchronization signal Vsync and the horizontal synchronization signal Hsync supplied from the outside may be omitted. The image data (RGB) includes luminance information of the pixels PX. The luminance is a predetermined gray number of, e.g., 1024 ($=2^{10}$), 256 ($=2^8$), or 64 ($=2^6$).

The timing controller 140 may generate control signals including a first gate timing control signal GDC1 for controlling the operation timing of the scan driver 120, a data timing control signal DDC for controlling the operation timing of the data driver 130, and a second gate timing control signal GDC2 for controlling the operation timing of the control driver 160.

The first gate timing control signal GDC1 may include a gate start pulse GSP, a gate shift clock GSC, and a gate output enable signal GOE. The gate start pulse GSP is supplied to the scan driver 120 generating the first scan signal at the start of the scan period. The gate shift clock GSC is a clock signal commonly input to the scan driver 120, and is a clock signal for shifting the gate start pulse GSP. The gate output enable GOE signal controls the output of the scan driver 120.

The data timing control signal DDC may include a source start pulse SSP, a source sampling clock SSC, and a source output enable SOE signal. The source start pulse SSP controls the data sampling start time of the data driver 130 and is provided to the data driver 130 at the start time of the scan period. The source sampling clock SSC is a clock signal for controlling the sampling operation of data in the data driver 130 on the basis of a rising or falling edge. The source output enable signal SOE may control the output of the data driver 130. The source start pulse SSP supplied to the data driver 130 may be omitted depending on a data transmission method.

The second gate timing control signal GDC2 may be provided to the control driver 160 to distinguish a plurality of periods in each frame period.

The scan driver 120 may generate the scan signals S1 to Sn in response to the first gate timing control signal GDC1 supplied from the timing controller 140 by using the turn-on voltage Von and the turn-off voltage Voff provided from the voltage generator 150. The scan driver 120 may provide the scan signals S1 to Sn to the pixels PX through the scan lines SL1 to SLn. According to an embodiment, the scan driver 120 may apply the turn-on voltage Von to the scan lines SL1 to SLn during the third initialization period and the compensation period. The scan driver 120 may sequentially apply the turn-on voltage Von to the scan lines SL1 to SLn during the data writing period. The scan driver 120 may apply the turn-off voltage Voff to the scan lines SL1 to SLn during the remaining period.

The data driver 130 may sample and latch the digital data signal RGB supplied from the timing controller 140 in response to the data timing control signal DDC supplied from the timing controller 140 to convert the digital data signal RGB into data of a parallel data system. When the data driver 130 converts the digital data signal RGB into the data of the parallel data system, the data driver 130 converts the digital data signal RGB into a gamma reference voltage and converts the gamma reference voltage into an analog data voltage. The data driver 130 provides the data voltage Vdata to the pixels PX of the display unit 110 through the data lines DL1 to DLm. The pixels PX may receive the data voltage Vdata in response to the scanning signal S. Further, the data driver 130 provides the reference voltage Vref to the pixels PX of the display unit 110 through the data lines DL1 to DLm.

The data driver 130 may output the reference voltage Vref to the data lines DL1 to DLm according to the data timing control signal DDC during at least a part of the period. The data driver 130 may output different data voltages Vdata to the data lines DL1 to DLm according to the data signals RGB during the data writing period. The data driver 130 may output the same reference voltage Vref to the data lines DL1 to DLm during a certain period.

The control driver 160 drives the first and second power supply lines PL1 and PL2 and the control line CL in response to the second gate timing control signal GDC2 supplied from the timing controller 140 by using voltages having different levels and provided from the voltage generator 150. For example, the control driver 160 may drive the first power supply line PL1 using the first level voltage PV1_h and the second level voltage PV1_l, may drive the second power supply line PL2 using the third level voltage PV2_h and the fourth level voltage PV2_l, and may drive the control line CL using the turn-on voltage Von and the turn-off voltage Voff.

According to an embodiment, the control driver 160 may apply the second level voltage PV1_l to the first power supply line PL1 during the first to third initialization periods, and may apply the first level voltage PV1_h to the first power supply line PL1 during the remaining period. The control driver 160 may apply the third level voltage PV2_h to the second power supply line PL2 during the non-light emission period, and may apply the fourth level voltage PV2_l to the second power supply line PL2 during the light emission period. However, this is illustrative, and the control driver 160 may apply voltages of different levels to the first and second power supply lines PL1 and PL2 in response to the second gate timing control signal GDC2. The control driver 160 may apply the turn-on voltage Von to the control line CL during the second and third initialization periods and the compensation period, and may apply the turn-off voltage Voff to the control line CL during the remaining period.

Although it is described in the present embodiment that the control driver 160 drives both the first and second power supply lines PL1 and PL2 and the control line CL, the control driver 160 may be divided into a first control driver for driving the control line CL and a second control driver for driving the first and second power supply lines PL1 and PL2. According to another embodiment, the first and second power supply lines PL1 and PL2 may be directly driven by the voltage generator 150, and the control line CL may be driven by the scan driver 120. In the present specification, the control driver 160 integrally refers to a component driving the first and second power supply lines PL1 and PL2 and a component driving the control line CL.

In the present specification, the component driving or controlling the first and second power supply lines PL1 and PL2, the data line DL, the scanning line SL, and the control line CL is referred to as a controller or a driver. The controller or the driver may include at least one of the scan driver 120, the data driver 130, the timing controller 140, the voltage generator 150, and the control driver 160. For example, the controller or the driver may collectively refer to the scan driver 120, the data driver 130, and the control driver 160.

The organic light emitting display device 100, which is a device for displaying an image, may be a portable device including a high-resolution display unit, for example, a smart phone or a head-mounted display. The organic light emitting display device 100 may be a television or a monitor having a large screen. The organic light emitting display device 100 according to the present embodiment may be used to implement an ultra-high resolution display panel having a resolution of about 1200 ppi (pixels per inch), for example, about 1600 ppi.

Figure 2:
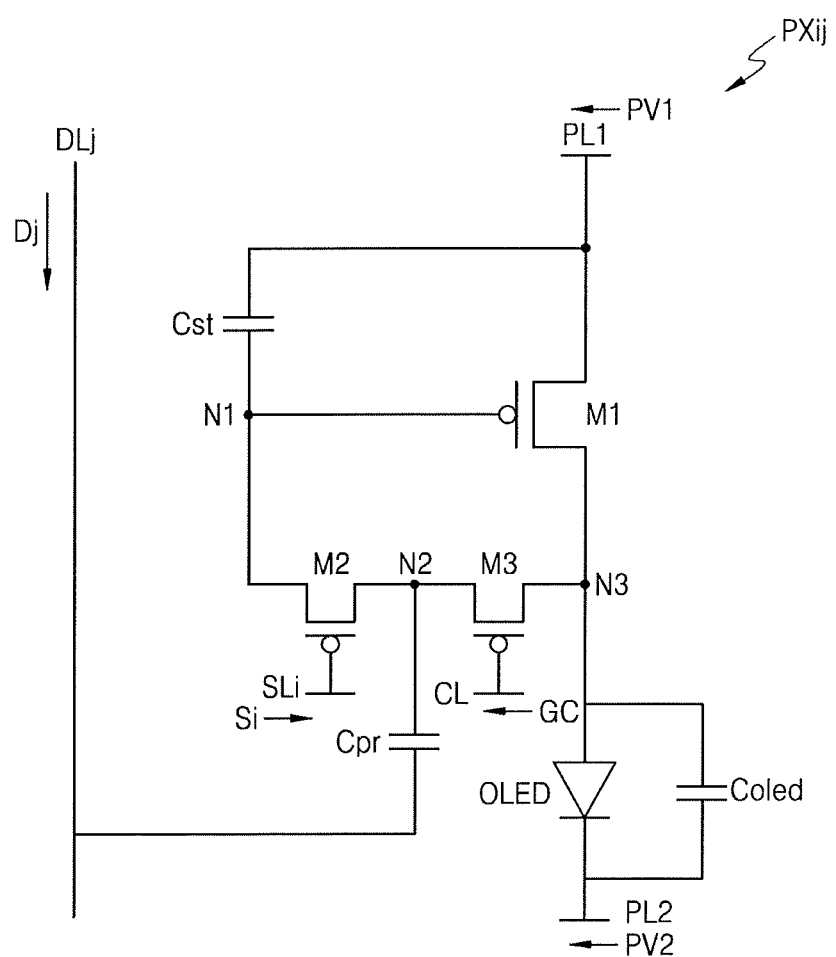
FIG. 2 illustrates a circuit diagram of a pixel according to an embodiment.

FIG. 2 is a circuit diagram of a pixel according to an embodiment. Referring to FIG. 2, a pixel PXij includes a light emitting element OLED, first to third transistors M1 to M3, and first and second capacitors Cst and Cpr. The pixel PXij has first to third nodes N1 to N3. The pixel PXij is connected to a scanning line SLi located in the same row among the scanning lines SL1 to SLn and receives a scanning signal Si from the scanning driver 120. The pixel PXij is connected to a data line DLj located in the same column among the data lines DL1 to DLm and receives a data signal Dj from the data driver 130. The pixel PXij is connected to the control line CL and the first and second power supply lines PL1 and PL2, and receives the control signal GC and the first and second power supply voltages PV1 and PV2 from the control driver 160.

The first transistor M1 may operate as a driving transistor for controlling a current flowing through the organic light emitting element OLED. The first transistor M1 may be referred to as a driving transistor. The second transistor M2 and the third transistor M3 may be turned on or turned off according to the voltage applied to the gate electrode, i.e., a gate voltage, thereby performing a switching function. The second and third transistors M2 and M3 may be referred to as first and second switching elements, or as first and second switching transistors, respectively.

Although the first to third transistors M1 to M3 are shown as being p-type MOSFETs, this is illustrative, and at least one of the first to third transistors M1-M3 may be a different conductive type (n-type) transistor. According to an embodiment, the first transistor M1 may be an n-type MOSFET. In this case, the anode of the light emitting element OLED may be connected to the second power supply line PL2, and the cathode thereof may be connected to the first transistor M1. Further, the voltage level applied to the second power supply line PL2 when the light emitting element OLED emits light may be higher than the voltage level applied to the first power supply line PL1. According to another embodiment, the second and third transistors M2 and M3 may be n-type MOSFETs. According to still another embodiment, the first to third transistors M1 to M3 may all be n-type MOSFETs.

The light emitting element OLED may be connected between the first power supply line PL1 and the second power supply line PL2. The light emitting element OLED may be connected to the first power supply line PL1 through the first transistor M1. The light emitting element OLED may be an organic light emitting diode. The light emitting element OLED may be an organic light emitting diode having an anode connected to the third node N3 and a cathode connected to the second power supply line PL2.

The first transistor M1 may be a driving transistor for controlling the current flowing from the first power supply line PL1 to the second power supply line PL2 through the light emitting element OLED according to the voltage of the first node N1. The first transistor M1 may have a gate electrode connected to the first node N1 and may be connected between the first power supply line PL1 and the third node N3. For example, the first transistor M1 may have a source electrode connected to the first power supply line PL1 and a drain electrode connected to the third node N3. The current controlled by the first transistor M1 is supplied to the light emitting element OLED during the light emitting period, and the light emitting element OLED emits light with a luminance corresponding to the intensity of the current.

The second transistor M2 may be a first switching element connected between the first node N1 and the second node N2 to connect or disconnect the first node N1 and the second node N2. The second transistor M2 may be controlled by a scan signal Si provided from the scan line SLi. The second transistor M2 may have a gate electrode connected to the scan line SLi, a first electrode connected to the first node N1, and a second electrode connected to the second node N2. When the turn-on voltage Von is applied to the gate electrode of the second transistor M2 through the scan line SLi, the second transistor M2 may be turned on to connect the first node N1 and the second node N2 to each other. When the turn-off voltage Voff is applied to the gate electrode of the second transistor M2, the second transistor M2 may be turned off to isolate the first node N1 and the second node N2 from each other.

The third transistor M3 may be a second switching element connected between the second node N2 and the third node N3 to connect or disconnect the second node N2 and the third node N3. The third transistor M3 may be controlled by a control signal GC provided from the control line CL. The third transistor M3 may have a gate electrode connected to the control line CL, a first electrode connected to the second node N2, and a second electrode connected to the third node N3. When the turn-on voltage Von is applied to the gate electrode of the third transistor M3 through the control line CL, the third transistor M3 may be turned on to connect the second node N2 and the third node N3 to each other. When the turn-off voltage Voff is applied to the gate electrode of the third transistor M3, the third transistor M3 may be turned off to isolate the second node N2 and the third node N3 from each other.

The first capacitor Cst may be connected between the first power supply line PL1 and the first node N1. The first capacitor Cst may be connected between the gate electrode and the source electrode of the first transistor M1. The first capacitor Cst may maintain the gate voltage of the first transistor M1 during the light emitting period. Since the voltage between the gate electrode and the source electrode of the first transistor M1 is kept constant by the first capacitor Cst even if the voltage level of the first power supply line PL1 fluctuates, the current output from the first transistor M1 may be constant. Although the voltage level of the first power supply line PL1 may be lowered according to the amount of current consumed by the pixels PX of the display unit 110, the first capacitor Cst maintains a constant voltage between the gate electrode and the source electrode of the first transistor M1, so that the luminance of the light emitted by the light emitting element OLED may be kept constant. Accordingly, the brightness uniformity of the display unit 110 can be increased.

The second capacitor Cpr may be connected between the data line DLj and the second node N2. The data voltage Vdata of the data signal Dj transmitted through the data line DLj may be transmitted to the first node N1 through the second capacitor Cpr and the second transistor M2. The capacitance of the second capacitor Cpr may be larger than that of the first capacitor Cst. For example, the capacitance of the second capacitor Cpr may be about two to three times the capacitance of the first capacitor Cst.

Figure 3:
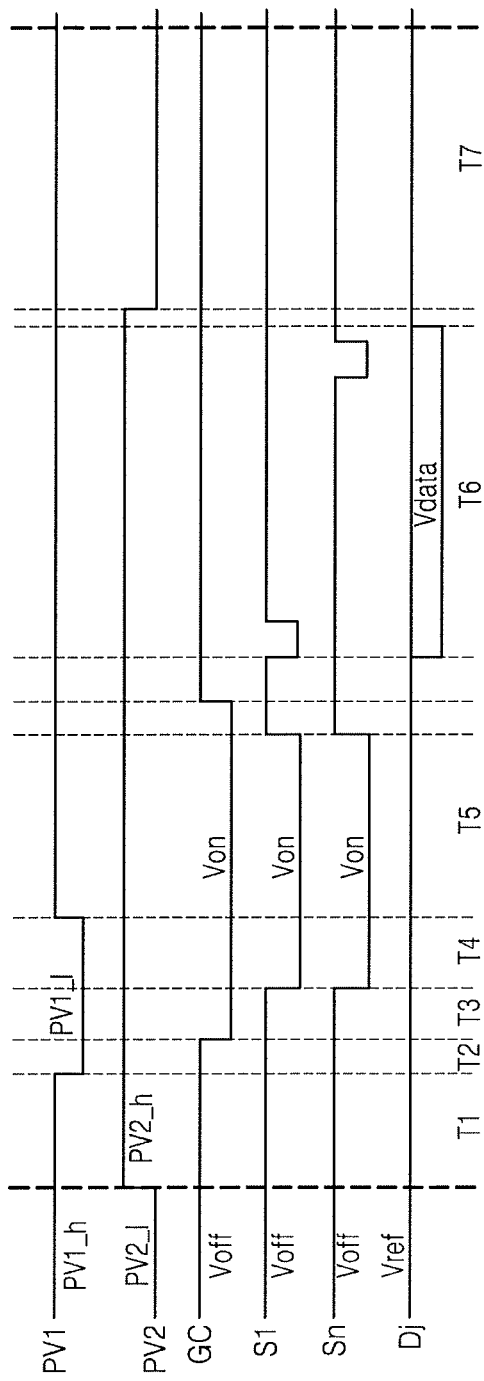
FIG. 3 illustrates a timing chart for driving the pixel of FIG. 2 according to an embodiment.

FIG. 3 is a timing chart for driving the pixel of FIG. 2 during one frame period. Referring to FIG. 3 together with FIG. 2, first and second power supply voltages PV1 and PV2, a control signal GC, first to nth scan signals S1 to Sn, and a data signal Dj are shown. One frame period includes a plurality of periods. The plurality of periods may include first to seventh periods T1 to T7. The first to seventh periods T1 to T7 may be sequential. However, according to some embodiments, some periods (for example, third and fourth periods T3 and T4) of the first to seventh periods T1 to T7 may be repeated a plurality of times. Further, the first to seventh periods T1 to T7 do not proceed continuously, and other periods may be further included. For example, a period during which the third transistor M3 is turned off by the control line CL may be included between the fifth period T5 and the sixth period T6.

The first period T1 may be referred to as a light-off period T1. The second to fourth periods T2 to T4 may be referred to as first to third initialization periods. The fifth period T5 may be referred to as a compensation period. The sixth period T6 may be referred to as a data writing period. The seventh period T7 may be referred to as a light emission period. The first to sixth periods T1 to T6 may be included in the non-light emission period during which the light emitting element OLED does not emit light, and the seventh period T7 may be included in the light emission period during which the light emitting element OLED emits light.

The control driver 160 shown in FIG. 1 applies the first and second power supply voltages PV1 and PV2 to the first and second power supply lines PL1 and PL2 as shown in FIG. 3. Further, the control driver 160 outputs the control signal GC to the control line CL as shown in FIG. 3. The scan driver 120 outputs the first to nth scan signals S1 to Sn to the first to nth scan lines SL1 to SLn as shown in FIG. 3. The data driver 130 outputs the reference voltage Vref and the data voltage Vdata as the data signal Dj to the data line DLj according to the data timing control signal DDC as shown in FIG. 3.

The control driver 160 may apply the first level voltage PV1_h to the first power supply line PL1 during the first, fifth, sixth, and seventh periods T1 and T5 to T7, and may apply the second level voltage PV1_l to the first power supply line PL1 during the second to fourth periods T2 to T4. The second level voltage PV1_l may be lower than the first level voltage PV1_h. Alternatively, when the first transistor M1 is an n-type MOSFET, the second level voltage PV1_l may be higher than the first level voltage PV1_h.

The control driver 160 may apply the third level voltage PV2_h to the second power supply line PL2 during the first to sixth periods T1 to T6, and may apply the fourth level voltage PV2_l to the second power supply line PL2 during the seventh period T7. The fourth level voltage PV2_l may be lower than the third level voltage PV2_h. Alternatively, when the first transistor M1 is an n-type MOSFET, the fourth level voltage PV2_l may be higher than the third level voltage PV2_h.

The control driver 160 may output a turn-off voltage Voff for turning off the third transistor M3 during the first, second, sixth, and seventh periods T1, T2, T6, and T7 to the control line CL, and may output a turn-on voltage Von for turning on the third transistor M3 during the third to fifth periods T3 to T5 to the control line CL.

The scan driver 120 may output a turn-off voltage Voff for turning off the second transistor M2 during the first, second, third, and seventh periods T1 to T3 and T7 to the scan line SLi, and may output a turn-on voltage Von for turning on the second transistor M2 during the fourth and fifth periods T4 and T5 to the scan line SLi. The scan driver 120 may temporarily output a pulse-like turn-on voltage Von in synchronization with the data voltage Vdata output to the data line DLj during the sixth period T6. The scan driver 120 may sequentially apply the pulse-like turn-on voltage Von to the scan lines SL1 to SLn during the sixth period T6. The scan driver 120 may apply a turn-off voltage Voff to the scan lines SL1 to SLn during the time when the turn-on voltage Von is not applied to the scan lines SL1 to SLn during the sixth period T6.

The data driver 130 may output the data voltage Vdata to the data line DLj in synchronization with the pulse-like turn-on voltage Von sequentially applied to the scan lines SL1 to SLn. For example, when the turn-on voltage Von is applied to the scan lines SL1 to SLn and the turn-off voltage Voff is applied thereto, e.g., when the scan signals S1 to Sn have rising edges, the data driver 130 may be in a state of outputting the data voltage Vdata to the data line DLj. Here, the data voltage Vdata refers to a data voltage received by the pixel PXij.

The data driver 130 may apply the data voltage Vdata to the data line DLj during the sixth period T6, and may apply the reference voltage Vref during at least the fourth and fifth periods T4 and T5. Here, the data voltage Vdata includes the data voltage received by the pixel PXij, and collectively refers to the data voltages respectively received by the plurality of pixels PX connected to the data line DLj. The data line DLj may be in a high-impedance state when the data voltage Vdata or the reference voltage Vref is not applied. According to another embodiment, as shown in FIG. 3, the data driver 130 may apply the data voltage Vdata to the data line DLj during the sixth period T6, and may apply the reference voltage Vref to the data line DLj during the first to fifth and seventh periods T1 to T5 and T7.

During the seventh period T7, i.e, the light emission period, the first level voltage PV1_h is applied to the first power supply line PL1, and the fourth level voltage PV2_l is applied to the second power supply line PL2_l. Further, the second and third transistors M2 and M3 are turned off, so that the first node N1 and the second node N2 are electrically isolated from each other and the second node N2 and the third node N3 are electrically isolated from each other. When the first transistor M1 is a p-type MOSFET as shown in FIG. 2, the first level voltage PV1_l may be higher than the fourth level voltage PV2_l. The first transistor M1 can control the amount of a current flowing from the first power supply line PL1 to the second power supply line PL2 through the light emitting element OLED according to the gate voltage, that is, the voltage of the first node N1. Here, the current flowing through the light emitting element OLED may be referred to as a driving current output from the first transistor M1.

Hereinafter, it is assumed that the first transistor M1 is a p-type MOSFET. However, when the first transistor M1 is an n-type MOSFET, the timing chart of FIG. 3 may be modified within the scope of the present disclosure and applied with the same principle.

When the first period T1, i.e., the light-off period, starts, the third level voltage PV2_h is applied to the second power supply line PL2. The third level voltage PV2_h may be continuously applied to the second power supply line PL2 from the start of the first period T1 until the end of the sixth period T6. During the first period T1 following the seventh period T7, the first level voltage PV1_h is applied to the first power supply line PL1, and the second and third transistors M2 and M3 are maintained in the turned-off state. The third level voltage PV2_h applied to the second power supply line PL2 may be substantially the same level as the first level voltage PV1_h applied to the first power supply line PL1. For example, the difference between the third level voltage PV2_h and the first level voltage PV1_h may be smaller than the threshold voltage of the light emitting element OLED. Accordingly, substantially no current may flow between the first power supply line PL1 and the second power supply line PL2, and the light emitting element OLED may not emit light any more.

According to another embodiment, the level of the third level voltage PV2_h may be higher than the level of the first level voltage PV1_h. Further, the voltage level of the third node N3 is raised by the light emitting element capacitor Coled by a second voltage difference (referred to as "ΔV2") between the third level voltage PV2_h and the fourth level voltage PV2_l. The second voltage difference ΔV2 is defined as an absolute value of a voltage difference between the third level voltage PV2_h and the fourth level voltage PV2_l. Since the light emitting element OLED functions not only as a light emitting diode, but also as a capacitor having a capacitance, the light emitting element OLED may be modeled as a light emitting diode and a light emitting element capacitor Coled connected in parallel with each other. The light emitting element capacitor Coled indicates a capacitance component of the light emitting element OLED.

When the second period T2, i.e., the first initiation period, starts the second level voltage PV1_l is applied to the first power supply line PL1. The second level voltage PV1_l may be continuously applied to the first power supply line PL1 from the start of the second period T2 until the end of the fourth period T4. During the second period T2 following the first period T1, the third level voltage PV2_h is applied to the second power supply line PL2, and the second and third transistors M2 and M3 are maintained in the turned-off state. The level of the second level voltage PV1_l applied to the first power supply line PL1 may be lower than the level of the third level voltage PV2_h applied to the second power supply line PL2.

As the voltage level of the first power supply line PL1 is lowered by a first voltage difference (referred to as "ΔV1") between the first level voltage PV1_h and the second level voltage PV1_l, the voltage level of the first node N1 is also lowered by the first voltage difference ΔV1 by the first capacitor Cst between the first power supply line PL1 and the first node N1. The first voltage difference ΔV1 is defined as an absolute value of a voltage difference between the first level voltage PV1_h and the second level voltage PV1_l. Accordingly, the first transistor M1 is turned on and current flows from the third node N3 to the first power supply line PL1, i.e., in a reverse direction. Since the voltage level of the first node N1 lowered by the first voltage difference ΔV1 is sufficiently lower than the voltage level of the third node N3 raised by the second voltage difference ΔV2, the first transistor M1 is fully turned on. Since the first transistor M1 is fully turned on in the reverse direction, hysteresis characteristics, in which the intensity of the driving current output from the first transistor M1 in the previous frame affects the intensity of the driving current output from the first transistor M1 in the current frame, may be reduced or eliminated.

Further, the voltage level of the third node N3 is lowered to approximately the level of the second level voltage PV1_l. Specifically, if the first transistor M1 is turned on during the light emission period of the previous frame, a current can flow through the first transistor M1 until the voltage level of the third node N3 is lowered to the level of the second level voltage PV1_*l*, so that the voltage level of the third node N3 becomes equal to the level of the second level voltage PV1_*l*. If the first transistor M1 is turned off and the light emitting element OLED does not emit light during the light emission period of the previous frame, the first transistor M1 is turned on in the reverse direction due to the voltage level of the third node N3 which is raised by the second voltage difference ΔV2, but the first transistor M1 is turned off before the voltage level of the third node N3 is lowered to the level of the second level voltage PV1_*l*. The voltage level of the third node N3 may be slightly higher than the level of the second level voltage PV1_*l*. Therefore, the voltage level of the third node N3 becomes lower than the third level voltage PV2_*h* applied to the second power supply line PL2 during the second period T2, so that the third node N3 is initialized, and the hysteresis characteristics of the transistor M1 can be reduced or eliminated.

When the third period T3, i.e., the second initialization period, starts, the third transistor M3 is turned on. The third transistor M3 may be turned on from the start of the third period T3 to the end of the fifth period T5. During the third period T3 following the second period T2, the second level voltage PV1_*l* is applied to the first power supply line PL1, the third level voltage PV2_*h* is applied to the second power supply line PL2, and the second transistor M2 is maintained in the turned-off state.

When the third transistor M3 is turned on, the second node N2 and the third node N3 are connected to each other, and the voltage level of the second node N2 becomes equal to the voltage level of the third node N3. The voltage level of the second node N2 is also lowered to about the level of the second level voltage PV1_*l* applied to the first power supply line PL1 by the first transistor M1 turned on in the reverse direction. Since the voltage level of the second node N2 is lowered during the third period T3, the second node N2 may be initialized.

When the fourth period T4, i.e., the third initialization period, starts, the second transistor M2 is turned on. The second transistor M2 may be turned on from the start of the fourth period T4 to the end of the fifth period T5. During the fourth period T4 following the third period T3, the second level voltage PV1_*l* is applied to the first power supply line PL1, the third level voltage PV2_*h* is applied to the second power supply line PL2, and the third transistor M3 is maintained in the turned-on state.

When the second transistor M2 is turned on, the first node N1 and the second node N2 are connected to each other, so that charges may be shared between the first capacitor Cst and the second capacitor Cpr. When the voltage of the first node N1 after the sharing of charges between the first capacitor Cst and the second capacitor Cpr is lower than the voltage (PV1_*l*−|Vth|) obtained by subtracting a threshold voltage (|Vth|) from the second level voltage PV1_*l* of the first power supply line PL1, the first transistor M1 is turned on. Since the gate electrode and the source electrode of the first transistor M1 are connected by the second and third transistors M2 and M3 in the turned-on state, the first transistor M1 is diode-connected, and the voltage of the first node N1 becomes equal to the voltage (PV1_*l*−|Vth|) obtained by subtracting the threshold voltage (|Vth|) from the second level voltage PV1_*l*. When the voltage of the first node N1 after the sharing of charges between the first capacitor Cst and the second capacitor Cpr is not lower than the voltage (PV1_*l*−|Vth|) obtained by subtracting a threshold voltage (|Vth|) from the second level voltage PV1_*l* of the first power supply line PL1, the first transistor M1 is not turned on. Even in this case, the voltage of the first node N1 may be lower than the second level voltage PV1_*l* of the first power supply line PL1. The threshold voltage (|Vth|) means an absolute value of the threshold voltage of the first transistor M1, and the threshold voltages |Vth| of the first transistor M1 may be different from each other for each of the pixels PX for reasons such as manufacturing tolerances and the like.

Since the voltage of the first node N1 becomes equal to the voltage of the second and third nodes N2 and N3, such that the voltage level of the first node N1 becomes lower than the voltage of the second level voltage PV1_*l* during the fourth period, the first node N1 may be initialized.

The reference voltage Vref may be applied to the data line DLj at least before the end of the fourth period T4. The reference voltage Vref may be applied to the data line DLj from the start of the fourth period T4. According to another embodiment, the reference voltage Vref may be applied to the data line DLj from the start of the light emission period of the previous frame.

The reference voltage Vref may be applied to the data line DLj during the fifth period T5 until the voltage of the first node N1 becomes substantially equal to the voltage (PV1_*h*−|Vth|) obtained by subtracting the threshold voltage (|Vth|) from the first level voltage PV1_*h*. The reference voltage Vref may be applied to the data line DLj until the end of the fifth period T5.

When the fifth period T5, i.e., the compensation period, starts, the first level voltage PV1_*h* is applied to the first power supply line PL1. The first level voltage PV1_*h* may be continuously applied to the first power supply line PL1 from the start of the fourth period T4 to the end of the first period T1 of the next frame. During the fifth period T5 following the fourth period T4, the third level voltage PV2_*h* is applied to the second power supply line PL2, and the second and third transistors M2 and M3 are maintained in the turned-on state. The first level voltage PV1_*h* applied to the first power supply line PL1 may be substantially equal to the third level voltage PV2_*h* applied to the second power supply line PL2. The voltage difference between the first level voltage PV1_*h* and the third level voltage PV2_*h* may be lower than the threshold voltage of the light emitting element OLED. The reference voltage Vref may be applied to the data line DLj during the fifth period T5.

As the voltage level of the first power supply line PL1 is increased by the first voltage difference (referred to as "ΔV1") between the first level voltage PV1_*h* and the second level voltage PV1_*l*, the voltage level of the first node N1 is also increased by the first capacitor Cst connected between the first power supply line PL1 and the first node N1. However, since the first node N1 is connected to the second capacitor Cpr through the second node N2 and is connected to the light emitting element capacitor Coled through the third node N3, the voltage level of the first node N1 becomes lower than the first voltage difference ΔV1. For example, the voltage of the first node N1 may be increased by a value obtained by multiplying the ratio of capacitance of the first capacitor Cst to the sum of capacitances of the first capacitor Cst, the second capacitor Cpr, and the light emitting element capacitor Coled by the first voltage difference ΔV1.

Since the sum of the capacitances of the second capacitor Cpr and the light emitting element capacitor Coled is greater than the capacitance of the first capacitor Cst, the voltage of the first node N1 may become significantly lower than the voltage (PV1_*h*−|Vth|) obtained by subtracting the threshold voltage (|Vth|) from the first level voltage PV1_*h*. Accordingly, the first transistor M1 may be fully turned on, and a current may flow from the first power supply line PL1 to the third node N3, i.e., in a forward direction. Since the first transistor M1 having been fully turned on in the reverse direction during the second period T2 is fully turned on in the forward direction during the fifth period T5, the hysteresis characteristics of the first transistor M1 can be reduced or eliminated.

Since the gate electrode and the source electrode of the first transistor M1 in the turned-on state are connected by the second and third transistors M2 and M3 in the turned-on state, the first transistor M1 is diode-connected, and the voltage of the first node N1 becomes equal to the voltage obtained by subtracting the threshold voltage (|Vth|) from the first level voltage $PV1\_h$. Accordingly, charges corresponding to the threshold voltage (|Vth|) may be stored between both electrodes of the first capacitor Cst. Charges corresponding to the threshold voltage (|Vth|) is stored between both electrodes of the first capacitor Cst in order to compensate the threshold voltage (|Vth|) of the first transistor M1 during the fifth period T5.

The voltage of the second node N2 also becomes equal to the voltage $(PV1\_h-|Vth|)$ obtained by subtracting the threshold voltage (|Vth|) from the first level voltage $PV1\_h$. Since the reference voltage Vref is applied to the data line DLj, the charges corresponding to $Vref-PV1\_h+|Vth|$ may be stored between both electrodes of the second capacitor Cpr.

The voltage of the third node N2 also becomes equal to the voltage $(PV1\_h-|Vth|)$ obtained by subtracting the threshold voltage (|Vth|) from the first level voltage $PV1\_h$. At this time, the voltage of the third node N3 may be lower than the third level voltage $PV2\_h$ of the second power supply line PL2.

The fifth period T5 may be finished while the second transistor M2 is turned off. The third transistor M3 may be turned off before the sixth section T6 starts after the second transistor M2 is turned off. According to another embodiment, the second transistor M2 and the third transistor M3 may be turned off at the end of the fifth period T5. According to still another embodiment, the third transistor T3 may be turned off at the end of the fifth period T5, only the second transistors T2 of the pixels PX connected to the second to the nth scanning lines SL2 to SLn may be turned off, and the second transistor T2 of the pixel PX connected to the first scanning line SL1 may be maintained in the turned-on state, e.g., the sixth period T6 would immediately follow the fifth period T5.

During the sixth period T6, i.e., the data writing period, following the fifth period T5, the first level voltage $PV1\_h$ is applied to the first power supply line PL1, the third level voltage $PV2\_h$ is applied to the second power supply line PL2, and the third transistor M3 is maintained in the turned-off state. A pulse-like turn on voltage Von may be applied to the scan lines SL1 to SLn in a preset order over the sixth period T6. The data voltage Vdata may be applied to the data line DLj in synchronization with the pulse-like turn on voltage Von applied to the scan lines SL1 to SLn in the preset order. Here, the data voltage Vdata refers to data voltages respectively received by the plurality of pixels PX connected to the data line DLj.

The second transistor M2 of the pixel PXij is turned on in response to the scan signal Si transmitted through the ith scan line Sli, i.e., when the turn-on voltage Von is applied to the ith scan line SLi. A data voltage Vdata corresponding to the pixel PXij may be applied to the data line DLj. The data voltage Vdata refers to a data voltage received by the pixel PXij among the plurality of pixels PX connected to the data line DLj.

The second node N2 is connected to the first node N1 through the second transistor M2 in the turned-on state, and is electrically isolated from the third node N3 by the third transistor M3 in the turned-off state. Since the second node N2 is connected with the first node N1, the voltage fluctuation of the data line DLj causes the voltage fluctuation of the first node N1 through the charge sharing of the first and second capacitors Cst and Cpr.

When the reference voltage Vref is applied to the data line DLj, charges corresponding to $Vref-PV1\_h+|Vth|$ are stored in both electrodes of the second capacitor Cpr, and charges corresponding to the threshold voltage (|Vth|) are stored in both electrodes of the first capacitor Cst. In this state, when the data voltage Vdata is applied to the data line DLj, the voltage of the first node N1 may vary by a value proportional to the difference between the data voltage Vdata and the reference voltage Vref. For example, the voltage of the first node N1 may vary by $Cst/(Cst+Cpr)*(Vdata-Vref)$. Since the voltage of the first node N1 is $PV1\_h-|Vth|$ in the fifth period T5, when the pixel Pxij receives the data voltage Vdata, the voltage of the first node N1 may be $PV1\_h-|Vth|+Cst/(Cst+Cpr)*(Vdata-Vref)$.

Each data voltage Vdata may be written into the first node N1 of the plurality of pixels PX connected to the data line DLj in this manner. When the sixth period T6 is finished, the second transistor M2 of all the pixels PX is turned off.

When the seventh period T7, i.e., the light emission period, starts, the fourth level voltage $PV2\_l$ is applied to the second power supply line PL2. The fourth level voltage $PV2\_l$ may be applied to the second power supply line PL2 continuously from the start of the seventh period T7 until the start of the first period T1 of the next frame. During the seventh period T7, the first level voltage $PV1\_h$ is applied to the first power supply line PL1, and the second and third transistors M2 and M3 are maintained in the turned-off state.

The first transistor M1 outputs a driving current according to the gate voltage, that is, the voltage of the first node N1. The first transistor M1 may output a driving current proportional to square of the value obtained by subtracting the threshold voltage (|Vth|) from the source-gate voltage of the first transistor M1. Since the source electrode of the first transistor M1 is connected to the first power supply line PL1, the source voltage of the first transistor M1 is equal to the first level voltage $PV1\_h$. Accordingly, the first transistor M1 may output a driving current proportional to the square of $Cst/(Cst+Cpr)*(Vdata-Vref)$. Since the driving current is determined regardless of the level of the first level voltage $PV1\_h$ and the level of the threshold voltage (|Vth|), the pixels PX of the display unit 110 may emit light of uniform luminance.

For example, in each of the pixels PX, the threshold voltages (|Vth|) of the first transistor M1 may be different from each other due to a process error or the like. However, according to the present embodiment, the deviation of the threshold voltage (|Vth|) is not reflected in the intensity of the driving current, so that the deviation of the threshold voltage (|Vth|) may be compensated. Further, when the pixels PX connected to the first power supply line PL1 consume a large amount of current, a voltage lower than the target level of the first level voltage $PV1\_h$ may be transmitted to the pixels PX connected to the end of the first power supply line PL1. However, according to the present embodiment, the level of the voltage transmitted through the first power supply line PL1 is not reflected in the intensity of the driving current, so that the organic light emitting display device 100 according to the present embodiment may have a uniform display quality.

According to a comparative example, a pixel may be connected to an initialization voltage line to which an initialization voltage Vinit having a plurality of levels is transmitted, and a first capacitor may be connected between the initialization voltage line and the gate electrode of the driving transistor. The turn-on and turn-off operations of the driving transistor may be more freely controlled by adjusting the level of the initialization voltage Vinit. However, in order to drive the pixel, the initialization voltage line is required to be in the display unit and another driving circuit for driving the initialization voltage line is further required. According to the present embodiment, since the initialization voltage line is not included, the size of the pixel PX, i.e., the area of the pixel PX can be further reduced, so that a larger number of pixels PX can be arranged in the same space. In addition, according to the present embodiment, another driving circuit for driving the initializing voltage line is not required, so that the manufacturing cost and the maintenance cost can be reduced.

The pixel PX according to an embodiment, although it includes only three transistors, can initialize the first transistor M1 to remove hysteresis characteristic, can compensate the threshold voltage Vth of the first transistor M1, and can insure the organic light emitting diode (OLED) fully emits light. Therefore, the organic light emitting display device 100 including the plurality of pixels PX may be manufactured to have an ultra-high resolution of 1200 ppi or higher, for example, approximately 1600 ppi, so that a video image with a clearer image quality can be displayed. In particular, the organic light emitting display device 100 may be useful when the viewer's eyes and a screen are very close to each other, e.g., a head-mounted display. The organic light emitting display device 100 may be implemented as a head-mounted display.

Figure 4:
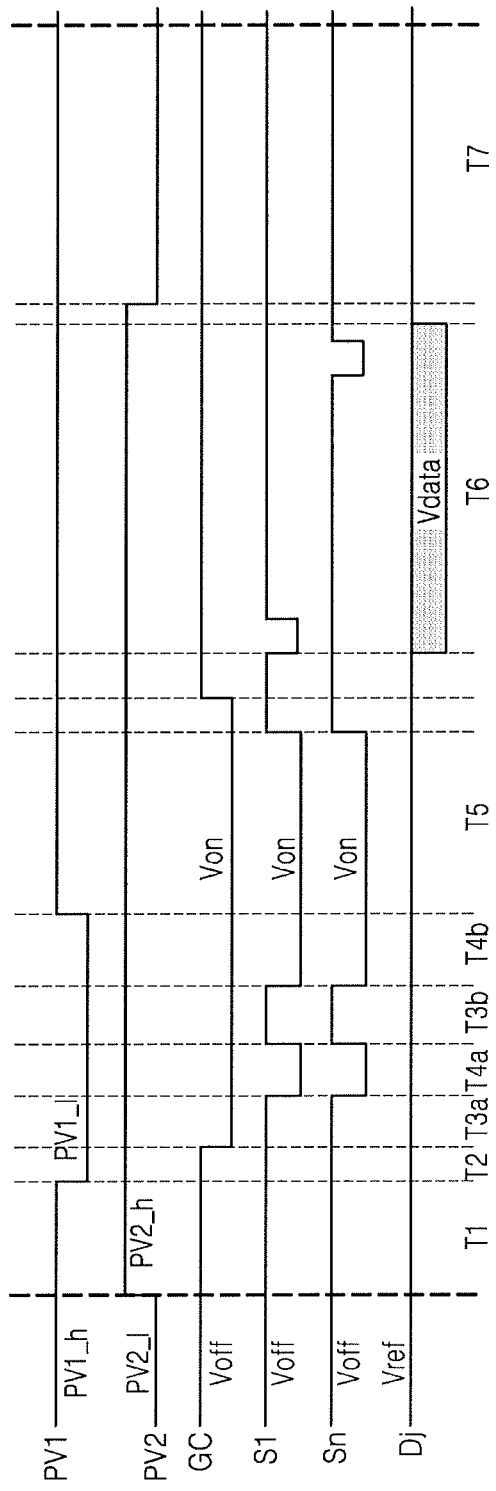
FIG. 4 illustrates a timing chart for driving the pixel of FIG. 2 according to another embodiment.

FIG. 4 is a timing chart for driving the pixel of FIG. 2 according to another embodiment. Referring to FIG. 4, first and second power supply voltages PV1 and PV2, a control signal GC, first to nth scan signals S1 to Sn, and a data signal Dj are shown.

Referring to the timing chart shown in FIG. 4, the third period T3 and the fourth period T4 shown in FIG. 3 may be repeated a plurality of times. That is, after the second period T2, the third period T3a and the fourth period T4a proceed, and the third period T3b and the fourth period T4b may proceed again. When the fourth period T4b is finished, the fifth to seventh periods T5 to T7 may be sequential as in the timing chart shown in FIG. 3. Thus, the voltage level of the first node N1 can be more reliably lowered than the second level voltage PV1_l.

Figure 5:
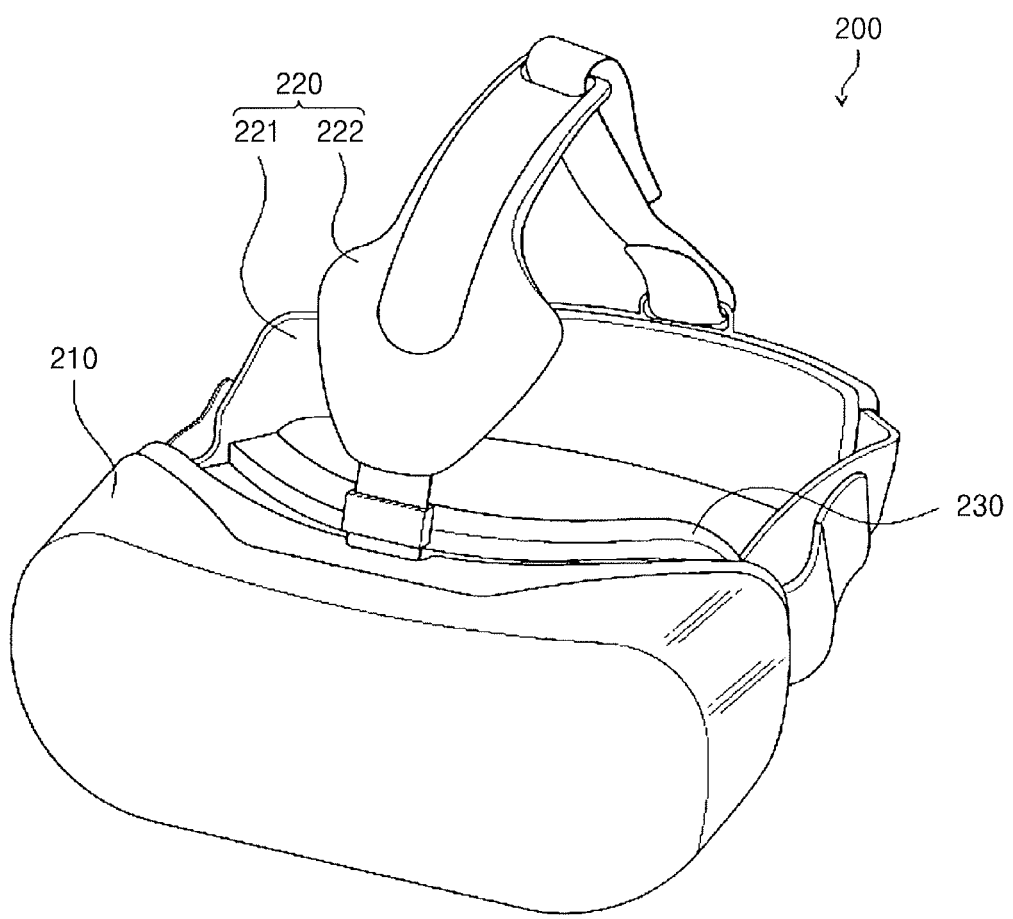
FIG. 5 illustrates a perspective view of a head-mounted display, which is an example of a display device according to an embodiment.
Figure 6:
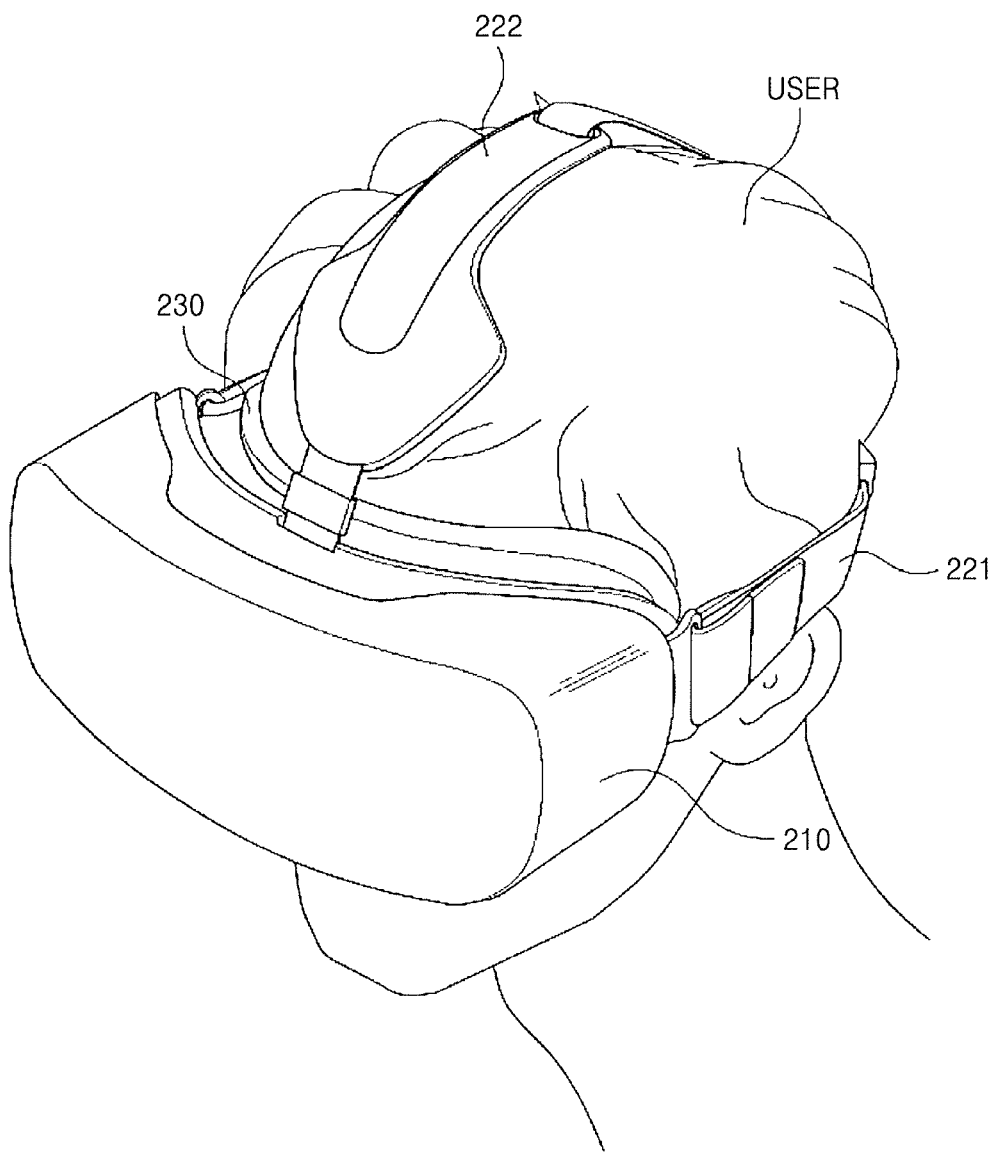
FIG. 6 illustrates a view showing use of the head-mounted display of FIG. 5.
Figure 7:
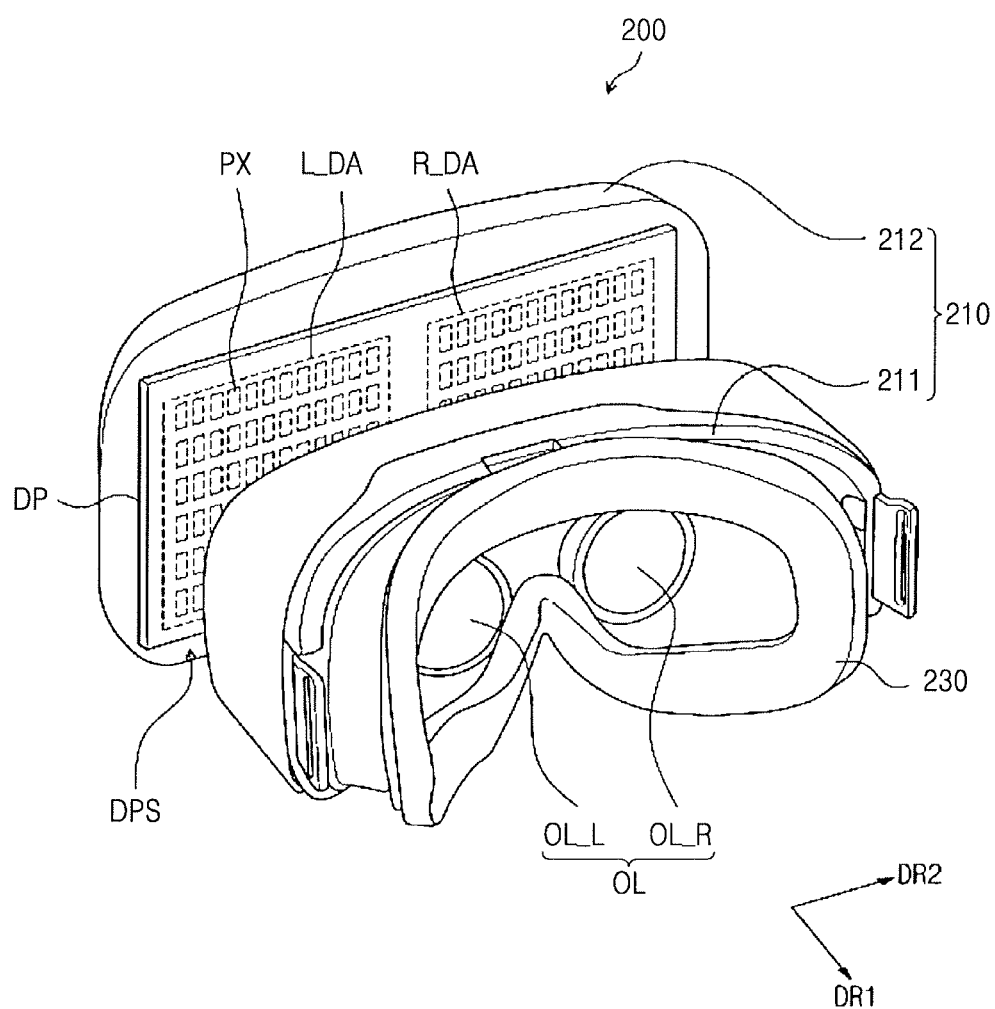
FIG. 7 illustrates a partial exploded perspective view of the head-mounted display of FIG. 5.

FIG. 5 is a perspective view of a head-mounted display, which is an example of a display device according to an embodiment. FIG. 6 is a use state view of the head-mounted display of FIG. 5. FIG. 7 is a partial exploded perspective view of the head-mounted display of FIG. 5.

Referring to FIGS. 5 and 6, a head-mounted display 200 is a device worn on the head of a user. The head-mounted display 200 may include a case 210, a strap unit 220, and a cushion unit 230. The head-mounted display 200 may include or be coupled with a display panel according to various embodiments of the present disclosure.

The case 210 may be worn on the head of a user USER. A display panel according to an embodiment and an acceleration sensor may be accommodated inside the case 210. The acceleration sensor may sense the motion of the user USER and may transmit a predetermined signal to the display panel. Accordingly, the display panel may provide an image corresponding to a change in the line of sight of the user USER. Therefore, the user USER can experience a virtual reality like an actual reality.

In addition to the display panel and the acceleration sensor, components having various functions may be accommodated in the case 210. For example, a proximity sensor for determining whether a user USER wears the case 210 may be accommodated in the case 210. Further, an operation unit (not shown) for adjusting a volume, screen brightness, or the like may be additionally disposed outside the case 210. The operation unit may be provided as a physical button, or may be provided in the form of a touch sensor or the like.

The strap unit 220 may be coupled with the case 210 to allow the user USER to easily wear the head-mounted display 200. The strap unit 220 may include a main strap 221 and an upper strap 222.

The main strap 221 may be worn along the periphery of the head of the user USER. The main strap 221 may fix the case 210 to the user such that the case 210 is be brought into close contact with the head of the user USER. The upper strap 222 may connect the case 210 and the main strap 221 along the upper portion of the head of the user USER. The upper strap 222 can prevent the case 210 from sliding down. The upper strap 222 can further improve the fitness of the user USER by dispersing the load of the case 210.

Although it is shown in FIG. 5 that each of the main strap 221 and the upper strap 222 has a length adjustable portion, the present disclosure is not limited thereto. For example, according to another embodiment, each of the main strap 221 and the upper strap 222 has elasticity, and thus the length adjustable portion may be omitted.

If the case 210 may be fixed to the user USER, the strap unit 220 may be modified into various forms in addition to those shown in FIGS. 5 and 6. For example, according to another embodiment, the upper strap 222 may be omitted. According to still another embodiment, the strap unit 220 may be modified into various shapes such as a helmet coupled with the case 210 and a pair of glass legs coupled with the case 210.

The cushion unit 230 may be between the case 210 and the head of the user USER. The cushion unit 230 may be made of a material that is freely deformable in shape. For example, the cushion unit 230 may include a polymer resin (e.g., polyurethane, polycarbonate, polypropylene, or polyethylene) or may be formed of a sponge obtained by foam-molding a rubber liquid, a urethane-based material or an acrylic-based material. However, the present disclosure is not limited thereto.

The cushion unit 230 allows the case 210 to be brought into close contact with the user, thereby improving the fitness of the user USER. The cushion unit 230 may be detached from the case 210. According to another embodiment, the cushion unit 230 may be omitted.

Referring to FIG. 7, the case 210 may be separated into a body 211 and a lid 212. a mounting space DPS for mounting a display panel DP is provided between the body 211 and the lid 212, and the lid may cover the mounting space DPS. Although it is illustratively shown in FIG. 7 that the body 211 and the lid 212 are separated from each other, alternatively, the body 211 and the lid 212 may be provided integrally.

The display panel DP may be in the mounting space DPS between the body 211 and the lid 212. The display panel DP may include pixels PX each having the pixel circuit shown in FIG. 2, and the pixels PX may be controlled or driven in accordance with the timing chart shown in FIG. 3 or FIG. 4. The display panel DP is integrally mounted in the head-mounted display 200 to provide an image.

According to another embodiment, a display device (e.g., a portable terminal) may be coupled with the head-mounted display 200 to provide an image. The display device may include pixels PX each having the pixel circuit shown in FIG. 2, and the pixels PX may be controlled or driven in accordance with the timing chart shown in FIG. 3 or FIG. 4.

In FIG. 7, a case where a left-eye image and a right-eye image are displayed through one display panel DP will be described as an example. The display panel DP may be divided into a left-eye image display area L_DA for displaying a left-eye image and a right-eye image display area R_DA for displaying a right-eye image. The left-eye image display area L_DA and the right-eye image display area R_DA may be driven by separate drivers. According to another embodiment, both the left-eye image display area L_DA and the right-eye image display area R_DA may be driven by one driver. According to still another embodiment, the display panel DP may include a left-eye display panel and a right-eye display panel that are separate from each other.

The display panel DP generates an image corresponding to the input image data. The display panel DP may include pixels PX each having the pixel circuit shown in FIG. 2. Each of the pixels PX may include three transistors and two capacitors, and may be connected to the first and second power supply lines PL1 and PL2, the data line DL, the scan line SL, and the control line CL. The pixels PX may be controlled or driven in accordance with the timing chart shown in FIG. 3 or FIG. 4.

An optical system OL may be inside the body 211 of the case 210. The optical system OL can enlarge an image provided from the display panel DP. Since the image displayed on the display panel DP is enlarged by the optical system OL and recognized by the user USER, a high-quality image can be provided to the user USER only when the resolution of the display panel DP is very high. The display panel DP according to an embodiment includes pixels PX each having a pixel circuit including three transistors, two capacitors, and a light emitting element. Therefore, the organic light emitting display device 100 including the pixels PX can be manufactured with an ultra-high resolution of 1200 ppi or higher, for example, about 1600 ppi, and thus an image having a clearer image quality can be displayed.

The optical system OL may be spaced apart from the display panel DP in the first direction DR1. The optical system OL may be between the display panel DP and the eye of the user USER. The distance between the optical system OL and the display panel DP may be adjusted depending on the visual acuity of the user USER.

The optical system OL may include a right eye optical system OL_R and a left eye optical system OL_L. The left eye optical system OL_L may enlarge an image and provide the enlarge image to the left pupil of the user USER, and the right eye optical system OL_R may enlarge an image and provide the enlarged image to the right pupil of the user USER. The left eye optical system OL_L and the right eye optical system OL_R may be spaced apart from each other in the second direction DR2 intersecting the first direction DR1. The distance between the right eye optical system OL_R and the left eye optical system OL_L may be adjusted corresponding to the distance between the two eyes of the user USER.

The optical system OL may be a convex aspherical lens. Each of the left eye optical system OL_L and the right eye optical system OL_R may be formed of only one lens. Alternatively, each of the left eye optical system OL_L and the right eye optical system OL_R may include a plurality of lenses.

According to various embodiments of the present disclosure, a pixel circuit includes only two switching transistors in addition to the driving transistor, and is connected to only one control line in addition to the scanning line and the data line. Therefore, the area of a pixel can be reduced, and the resolution of the display device including such a pixel can be increased. Further, the pixel circuit according to the various embodiments of the present disclosure can simultaneously solve a problem of non-uniformity of the threshold voltage of the driving transistor, a problem that the driving transistor has hysteresis characteristic, and a problem that the organic light emitting diode slightly emits light. Accordingly, the display device according to various embodiments of the present disclosure can display an image of ultra-high resolution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for driving a pixel circuit, the pixel circuit to be connected to a data line and first and second power supply lines and comprising:
    a light emitting element connected between the first power supply line and the second power supply line;
    a driving transistor to control a current flowing from the first power supply line to the second power supply line through the light emitting element according to a voltage of a first node;
    a first switching element connected between the first node and a second node;
    a second switching element connected between the second node and a third node;
    a first capacitor connected between the first power supply line and the first node; and
    a second capacitor connected between the second node and the data line, the method comprising:
    during a light emission period in which the light emitting element emits light, applying a first level voltage to the first power supply line and applying a second level voltage to the second power supply line,
    during at least a part of a non-light emission period in which the light emitting element does not emit light, applying a third level voltage different from the first level voltage to the first power supply line, and
    during the non-light emission period, applying a fourth level voltage different from the second level voltage to the second power supply line.

2. The method as claimed in claim 1, wherein the driving transistor includes:
a gate electrode connected to the first node,
a source electrode connected to the first power supply line, and
a drain electrode connected to the third node.

3. The method as claimed in claim 1, wherein the light emitting element includes an organic light emitting diode connected between the third node and the second power supply line.

4. The method as claimed in claim 1, wherein the first switching element includes:
a first switching transistor having a gate electrode connected to a scan line,
a first electrode connected to the first node, and
a second electrode connected to the second node.

5. The method as claimed in claim 1, wherein the second switching element includes a second switching transistor having a gate electrode connected to a control line, a first electrode connected to the second node, and a third electrode connected to the third node.

6. The method as claimed in claim 1, wherein, during the non-light emission period, after applying the third level voltage to the first power supply line, sequentially turning on the second switching element and the first switching element.

7. The method as claimed in claim 6, wherein, during the non-light emission period, after sequentially turning on the second switching element and the first switching element, applying the first level voltage to the first power supply line.

8. The method as claimed in claim 7, wherein, during the non-light emission period, after applying the first level voltage to the first power supply line, turning off the first and second switching elements while applying a reference voltage to the data line.

9. The method as claimed in claim 7, wherein, during the non-light emission period after applying the first level voltage to the first power supply line, maintaining the second switching element in a turn-off state, and changing the first switching element from a turn-on state to a turn-off state while applying a data voltage to the data line.

10. A display device, comprising:
a first power supply line;
a second power supply line;
a data line;
a pixel including:
a first switching element connected between a first node and a second node,
a second switching element connected between the second node and a third node,
a driving transistor to control a current flowing from the first power supply line to the third node according to a voltage of the first node,
a light emitting element connected between the third node and the second power supply line,
a first capacitor connected between the first power supply line and the first node, and
a second capacitor connected between the second node and the data line; and
a controller to control the first and second switching elements, the first and second power supply lines, and the data line, during one frame period including first to seventh sequential periods, wherein, during the seventh period, the controller is to:
apply a first level voltage to the first power supply line,
apply a second level voltage to the second power supply line, and
turn off the first and second switching elements.

11. The display device as claimed in claim 10, wherein, during the first period, the controller:
apply the first level voltage to the first power supply line,
apply a fourth level voltage different from the second level voltage to the second power supply line, and
turn off the first and second switching elements.

12. The display device as claimed in claim 10, wherein, during the second period, the controller is to:
apply a third level voltage different from the first level voltage to the first power supply line,
apply a fourth level voltage different from the second level voltage to the second power supply line, and
turn off the first and second switching elements.

13. The display device as claimed in claim 10, wherein, during the third period, the controller is to:
apply a third level voltage different from the first level voltage to the first power supply line,
apply a fourth level voltage different from the second level voltage to the second power supply line, and
turn off the first switching element and turn on the second switching element.

14. The display device as claimed in claim 10, wherein, during the fourth period, the controller is to:
apply a third level voltage different from the first level voltage to the first power supply line,
apply a fourth level voltage different from the second level voltage to the second power supply line, and
turn on the first and second switching elements.

15. The display device as claimed in claim 10, wherein, during the fifth period, the controller is to:
apply the first level voltage to the first power supply line,
apply a fourth level voltage different from the second level voltage to the second power supply line, and
turn on the first and second switching elements.

16. The display device as claimed in claim 10, wherein, during the sixth period, the controller is to:
apply the first level voltage to the first power supply line,
apply a fourth level voltage different from the second level voltage to the second power supply line,
turn off the second switching element, and
change the first switching element from a turn-on state to a turn-off state while applying a data voltage to the data line.

17. The display device as claimed in claim 10, wherein the controller is to apply a reference voltage to the data line during at least the fourth and fifth periods.

18. An organic light emitting display device, comprising:
a pixel connected to a first power supply line, a second power supply line, a scan line, a control line, and a data line; and
a driver to control the first power supply line, the second power supply line, the scan line, the control line, and the data line, during first to seventh sequential periods,
wherein the pixel includes:
an organic light emitting diode including a first electrode and a second electrode, the second electrode being connected to the second power supply line;
a first transistor including a gate electrode, a first electrode connected to the first power supply line, and a second electrode connected to the first electrode of the organic light emitting diode;
a second transistor including a control electrode connected to the scan line, a first electrode connected to the gate electrode of the first transistor, and a second electrode;

a third transistor including a control electrode connected to the control line, a first electrode connected to the second electrode of the second transistor, and a second electrode connected to the second electrode of the first transistor;

a first capacitor connected between the first power supply line and the gate electrode of the first transistor; and a second capacitor connected between the second electrode of the second transistor and the data line, wherein the driver is to:

apply a first level voltage to the first power supply line during the seventh period, apply a second level voltage different from the first level voltage to the first power supply line during at least one period from among the first to sixth periods, apply a third level voltage to the second power supply line during at least one period from among the first to sixth periods, and apply a fourth level voltage different from the third level voltage to the second power supply line during the seventh period.

19. The display device as claimed in claim 18, wherein the driver is to:

apply the first level voltage to the first power supply line during the first, fifth, sixth, and seventh periods, and apply the second level voltage to the first power supply line during the second to fourth periods.

20. The display device as claimed in claim 18, wherein the driver is to:

apply the third level voltage to the second power supply line during the first to sixth periods.

21. The display device as claimed in claim 18, wherein the driver is to:

apply a turn-off voltage for turning off the third transistor to the control line during the first, second, sixth, and seventh periods, and apply a turn-on voltage for turning on the third transistor to the control line during the third to fifth periods.

22. The display device as claimed in claim 18, wherein the driver is to:

apply a turn-off voltage for turning off the second transistor to the scan line during the first, second, third, and seventh periods, apply a turn-on voltage for turning on the second transistor to the scan line during the fourth and fifth periods, and temporarily apply a turn-on voltage to the scan line in synchronization with a data voltage applied to the data line during the sixth period.

23. The display device as claimed in claim 18, wherein the driver is to:

apply a data voltage to the data line during the sixth period, and apply a reference voltage to the data line during the fourth and fifth periods.

* * * * *